US008390974B2

(12) United States Patent
Loewe

(10) Patent No.: US 8,390,974 B2
(45) Date of Patent: Mar. 5, 2013

(54) OVERVOLTAGE AND OVERCURRENT PROTECTION SCHEME

(75) Inventor: Thomas Loewe, Wonder Lake, IL (US)

(73) Assignee: Snap-On Incorporated, Kenosha, WI (US)

( * ) Notice: Subject to any disclaimer, the term of this patent is extended or adjusted under 35 U.S.C. 154(b) by 176 days.

(21) Appl. No.: 12/859,077

(22) Filed: Aug. 18, 2010

(65) Prior Publication Data
US 2012/0044607 A1 Feb. 23, 2012

(51) Int. Cl.
*H02H 9/08* (2006.01)
(52) U.S. Cl. .................................. 361/93.7; 361/93.9
(58) Field of Classification Search ......... 361/93.7–93.9
See application file for complete search history.

(56) References Cited

U.S. PATENT DOCUMENTS

| | | | |
|---|---|---|---|
| 4,021,730 A | 5/1977 | Brinegar | |
| 4,525,765 A * | 6/1985 | Brajder | 361/88 |
| 4,853,850 A | 8/1989 | Krass, Jr. et al. | |
| 5,024,186 A | 6/1991 | Long | |
| 5,467,242 A * | 11/1995 | Kiraly | 361/94 |
| 5,698,887 A * | 12/1997 | Kumano et al. | 257/467 |
| 5,884,202 A | 3/1999 | Arjomand | |
| 6,088,207 A | 7/2000 | Sugiura et al. | |
| 6,222,374 B1 | 4/2001 | Shoemaker | |
| 6,278,919 B1 | 8/2001 | Hwang et al. | |
| 7,468,874 B1 | 12/2008 | Guo | |
| 2001/0055978 A1 | 12/2001 | Herrod et al. | |
| 2002/0059012 A1 | 5/2002 | Ogawa et al. | |
| 2002/0059156 A1 | 5/2002 | Hwang | |
| 2002/0156948 A1 | 10/2002 | Smith | |
| 2007/0136020 A1 | 6/2007 | Yasui et al. | |
| 2008/0004766 A1 | 1/2008 | Gallo | |

FOREIGN PATENT DOCUMENTS

| | | |
|---|---|---|
| EP | 1357461 | 10/2003 |
| JP | 57013335 | 1/1982 |

* cited by examiner

*Primary Examiner* — Danny Nguyen
(74) *Attorney, Agent, or Firm* — McDonnell Boehnen Hulbert Berghoff LLP

(57) ABSTRACT

Disclosed are methods and corresponding systems to detect and prevent and/or eliminate overload conditions for a transistor. According to an embodiment, a method includes providing an input signal to a base terminal of a transistor for a first amount of time, determining if an overload condition exists at the transistor, disabling the transistor for a second amount of time when the overload condition exists at the transistor, and providing the communication signal to the base terminal upon expiration of the second amount of time. Additional overload conditions can be checked upon expiration of the second amount of time as well.

14 Claims, 10 Drawing Sheets

OVERVOLTAGE AND OVERCURRENT PROTECTION SCHEME

BACKGROUND

Vehicles, such as automobiles, light-duty trucks, and heavy-duty trucks, play an important role in the lives of many people. To keep vehicles operational, some of those people rely on vehicle technicians to diagnose and repair their vehicle.

Vehicle technicians use a variety of tools in order to diagnose and/or repair vehicles. Those tools may include common hand tools, such as wrenches, hammers, pliers, screwdrivers and socket sets, or more vehicle-specific tools, such as cylinder hones, piston ring compressors, and vehicle brake tools. The tools used by vehicle technicians may also include electronic tools such as a digital voltage-ohm meter (DVOM) or a vehicle scan tool that communicates with an electronic control unit (ECU) within a vehicle.

Modern vehicles have evolved into very complex machines with thousands of various parts that perform a vast array of operations that permit the vehicle to be operated by the user. Additionally, more and more vehicle operations that previously were controlled by mechanical interactions are instead being controlled by electronic control circuits and logic. As with any such complex machine, malfunctions may occur in one or more parts of the vehicle from time to time, including the electronic control circuits.

As a result, vehicle technicians must now rely on sophisticated electronic equipment to diagnose and repair vehicular malfunctions. In order to ease the mechanic's access to the electronic equipment within the vehicle, modern vehicles include an on-board diagnostic port (OBD port) or a diagnostic link connector (DLC). An OBD port or DLC generally comprises a plug-in type connector that is coupled to an on-board computer within the vehicle. The on-board computer is then coupled to various sensors at various places within the vehicle. The sensors can report present operating characteristics of vehicle elements and/or sense the existence of error conditions or malfunctions of the various vehicle elements. By plugging in an appropriate scanner device into the OBD or DLC, status or error codes can be retrieved from the OBD or DLC. These error codes may provide information as to the source of a malfunction in the electronic control circuits in the vehicle.

In addition to obtaining error codes and other diagnostic information from the OBD and/or DLC, portions of a scanner may interface with one or more of the vehicle's signal lines in order to provide instructions or communicate with a vehicle operator. For example, such signal lines may serve to drive incandescent light bulbs or light emitting diodes (LEDs) that may be visible to a vehicle operator. But like other vehicle elements, these signal lines may also be subject to error condition or malfunction (e.g., an electrical short) whereupon connecting the scanner device to the vehicle would result in irreversible damage to the scanner. Thus, methods and systems for preventing and/or eliminating such error conditions may be desired.

OVERVIEW

In one respect, an example embodiment takes the form of a method for protecting against transistor overload. The method includes providing an input signal to a base terminal of a transistor for a first amount of time, upon expiration of the first amount of time, making a determination of whether an overload condition exists at the transistor, disabling the transistor for a second amount of time when the determination is that an overload condition exists at the transistor, and providing the input signal to the base terminal upon expiration of the second amount of time.

In another respect, an example embodiment takes the form of a circuit. The circuit includes a first signal line coupled to a collector terminal of a transistor and an overload protection module coupled between a second signal line and a base terminal of the transistor. The overload protection module includes means for applying a signal to the base terminal of a transistor for a first amount of time, the signal being representative of a signal on the second signal line, means for making a determination of whether an overload condition exists at the transistor upon expiration of the first amount of time, means for disabling the transistor for a second amount of time when the determination is that an overload condition exists at the transistor, and means for applying the signal to the base terminal upon expiration of the second amount of time.

In yet another respect, an example embodiment takes the form of software instructions for preventing and/or eliminating an overload condition at a transistor. The instructions, which when executed by a computing device, cause the computing device to carry out functions that include providing an input signal to a base terminal of a transistor for a first amount of time, upon expiration of the first amount of time, making a determination of whether an overload condition exists at the transistor, disabling the transistor for a second amount of time when the determination is that an overload condition exists at the transistor, and providing the input signal to the base terminal upon expiration of the second amount of time.

These as well as other aspects and advantages will become apparent to those of ordinary skill in the art by reading the following detailed description, with reference where appropriate to the accompanying drawings. Further, it should be understood that the embodiments described in this overview and elsewhere are intended to be examples only and do not necessarily limit the scope of the claims.

BRIEF DESCRIPTION OF THE DRAWINGS

Example embodiments are described herein with reference to the drawings, in which.

DETAILED DESCRIPTION

I. Introduction

This description describes example methods and systems for preventing and/or eliminating overload conditions at electronic circuits and corresponding components. Such methods and systems may be utilized in conjunction with a vehicle diagnostic scanner module or can be utilized in conjunction with any appropriate electronic circuit regardless of function.

The embodiments described herein may include or be utilized with any appropriate voltage or current source, such as a battery, an alternator, a fuel cell, and the like, providing any appropriate current and/or voltage, such as about 12 Volts, about 24 Volts, about 42 Volts and the like.

Figure 1:
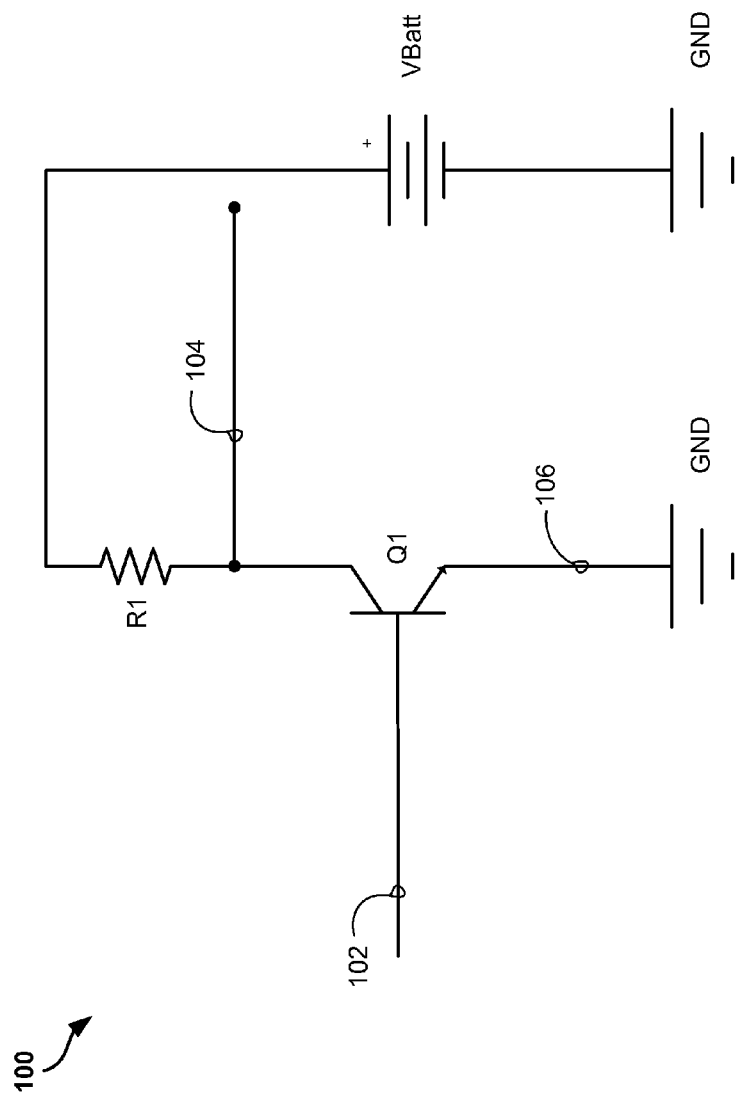
FIG. 1 is an illustration of an example circuit.

FIG. 1 illustrates an example electrical circuit 100 that may be integrated in or otherwise associated with a vehicle diagnostic scanner module. Circuit 100 includes an input signal line 102 coupled to a base terminal of an open collector transistor Q1. A collector terminal of transistor Q1 is coupled to an output signal line 104, and an emitter terminal of transistor Q1 is coupled to a ground terminal line 106. A power source (VBatt) and a pull-up resistor R1 may serve to apply a voltage to the output signal line 104.

Generally, the open collector transistor Q1 is operable to apply a low voltage (e.g., via a ground terminal line 106) to the output signal line 104. Applying a low or ground voltage to the output signal line 104 may, for example, actuate vehicle components that are coupled to the output signal line 104, such as relays, incandescent light bulbs, LEDs, etc (not shown).

In order to apply a low voltage to the output signal line 104, a high voltage on the input signal line 102 is applied to the base terminal of transistor Q1. This creates a conduction channel in the transistor Q1 between the collector and emitter terminals. Thus, the output signal line will be coupled to ground line 106. On the other hand, in order to apply a high voltage to the output signal line 104, a low voltage on the input signal line 102 is applied to the base terminal of transistor Q1. This eliminates a conduction channel in the transistor Q1. Thus, the output signal line 104 will be coupled to the power source (VBatt) via the pull-up resistor R1.

The electrical circuit 100 illustrates one example configuration of a transistor that may be coupled to an output signal line, which in turn, may be coupled to one or more vehicle components. Other types of electrical circuits and other types of transistor configurations may exist as well.

Figure 2:
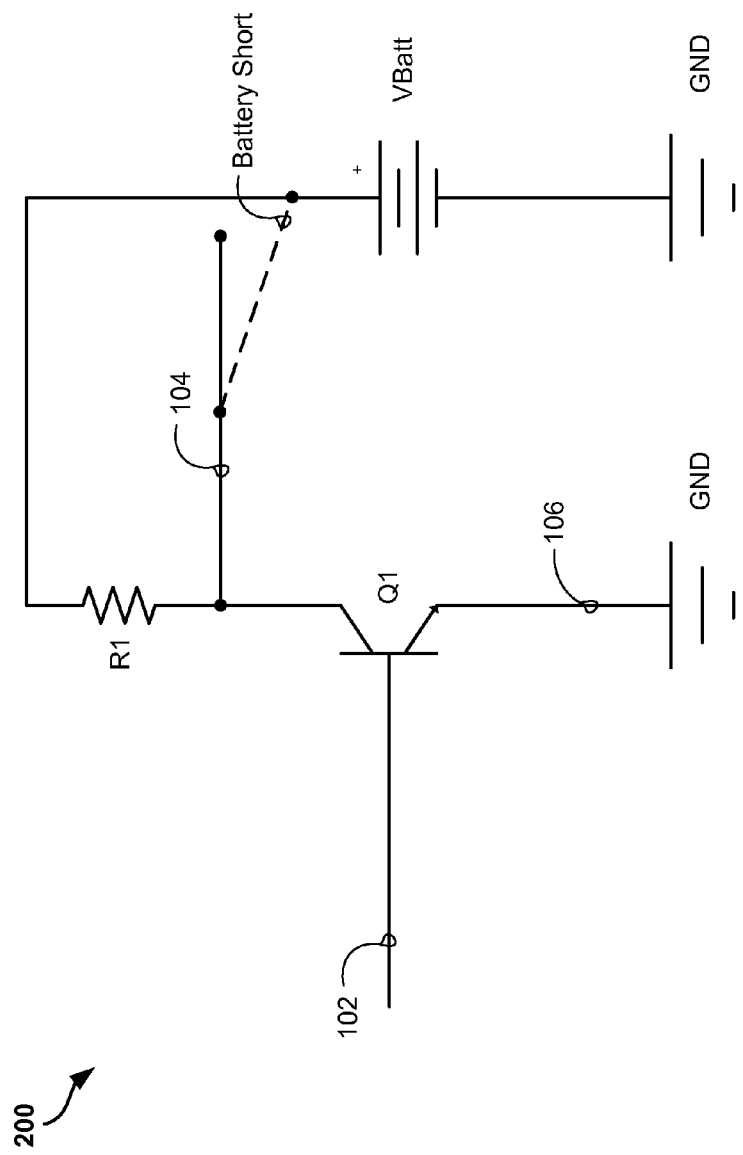
FIG. 2 is an illustration of an example circuit having an error condition.

FIG. 2 illustrates an example electrical circuit 200 that has an error condition, or malfunction, where the power source (VBatt) is inadvertently shorted to the output signal line 104. Such an error condition may occur for a variety of reasons, including faulty wiring, improper cable usage, and/or physical damage to a vehicle such a crash or heat damage. If the transistor Q1 tries to apply a ground voltage to the output signal line 104 while the output signal line 104 is shorted to a power source, the transistor Q1 will be damaged or destroyed.

One form of transistor damage may result from the transistor generating too much heat. The amount of heat generated by a transistor is a function of the power consumed by that transistor. The more power that a transistor consumes, the hotter that transistor will get. If a transistor generates more heat than can be dissipated, the temperature of the transistor may rise to a point where the transistor becomes irreversibly damaged. This is known as transistor breakdown and is one form of an overload condition at transistor Q1. Such a breakdown may result in the transistor becoming a permanently conducting device (i.e., unable to turn off) or a permanently open device (i.e., unable to turn on), thus possibly rendering an electrical circuit utilizing the transistor useless. Accordingly, methods and systems are desired for preventing and/or eliminating this and other overload conditions.

II. Example Architecture and Operation

Figure 3:
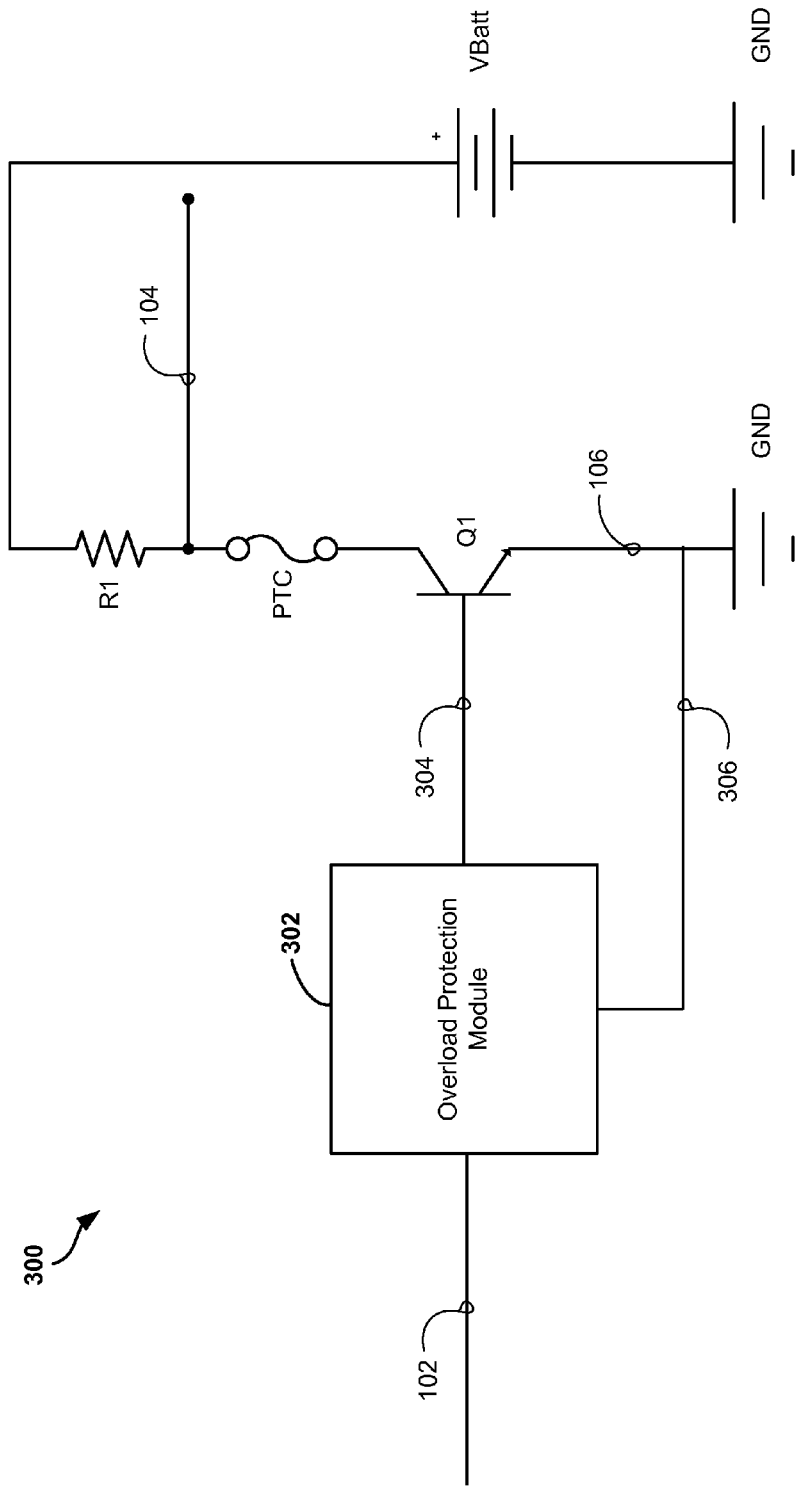
FIG. 3 is an illustration of an example circuit that includes components for preventing and/or eliminating an overload condition in accordance with at least some embodiments described herein.

FIG. 3 illustrates an example electrical circuit 300 that includes components designed to prevent and/or eliminate overload conditions on the transistor Q1. As illustrated in FIG. 3, the components may include a positive temperature coefficient (PTC) device coupled between the transistor Q1 and the pull-down resistor R1, and an Overload Protection Module (OPM) coupled between the input signal line 102 and the base terminal of the transistor Q1. Circuit 300 includes a module output signal line 304 as a means to couple the OPM to the base terminal of the transistor Q1. Circuit 300 also includes a feedback line 306 as a means to provide to the OPM 302 an indication of the current flowing through the transistor Q1.

A PTC device is designed to act as a self-resetting fuse by "tripping" or creating a high resistance circuit when at least a threshold extent of current flows through the PTC device. In order to trip the circuit when at least a threshold extent of current flows, the PTC device is designed to generate heat proportional to the amount of current that is flowing through the PTC device. The generated heat in the PTC device changes the crystalline structure of the PTC device so that the device becomes less conducting, or rather, becomes highly resistive. This limits the current in the circuit. Upon cooling, the PTC device returns to normal conductivity. It should be understood that a PTC device is one type of self-resetting fuse, and other types may be used as well.

The PTC device may take an appreciable amount of time to heat up (e.g., one to two seconds) and to trip the circuit. Therefore, this device may be used as a means to help protect the transistor when the transistor generates heat at a relatively slow place (e.g., one to two seconds). For example, a typical transistor that may be used in an example electrical circuit (such as circuit 300) may be able to conduct a maximum of about 0.7 amps and be able to continually dissipate about 0.5 watts. If an operating voltage of about 1 volt and a load of about 0.7 amps are required, the power consumed by the transistor will be about equal to 0.7 watts. Since the transistor may only be able to dissipate 0.5 of the 0.7 total watts, the transistor heats up at a relatively slow pace. This slow pace may give the PTC device time to heat up as well and reduce the current in the circuit before the transistor is irreversibly damaged.

In another example where the power source (VBatt) is shorted to the output signal line 104, the voltage across the transistor may be as high as 36 volts (or higher depending on the battery voltage and the application). A transistor conducting 0.7 amps with a voltage drop of about 36 volts will produce about 25.2 watts. This is a considerable amount of power compared with 0.7 watts, and accordingly, the transistor will be destroyed almost immediately. A PTC device may not have time to heat up and trip out before the transistor is destroyed. Consequently, an additional method of overload protection may be desired and implemented by an OPM 302.

Figure 4:
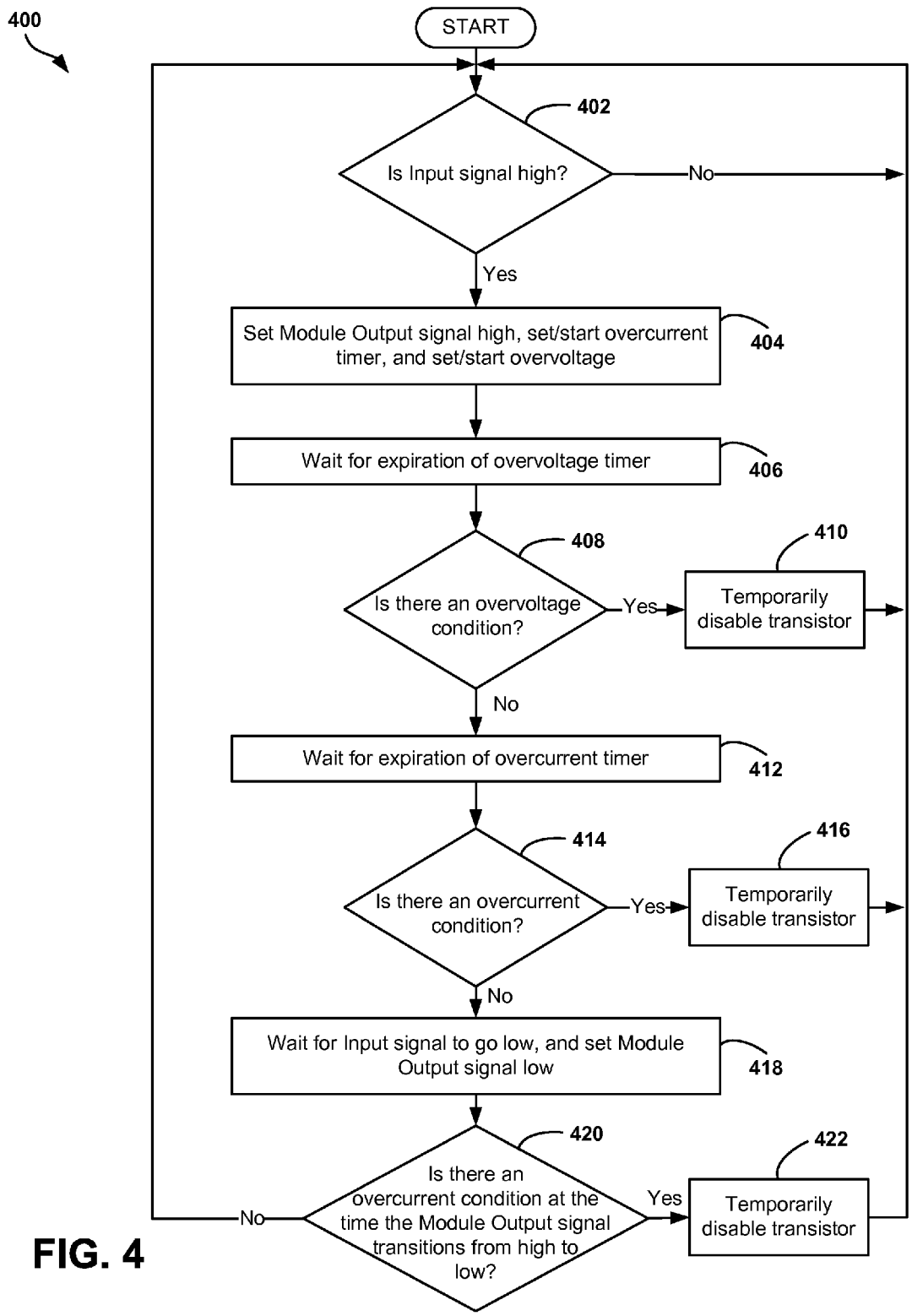
FIG. 4 is a flow diagram illustrating example steps of an overload protection method that are adapted in accordance with at least some embodiments described herein.

FIG. 4 is a flow diagram illustrating an example Overload Protection method 400. Example method 400 may include one or more operations, functions, or actions as illustrated by one or more of blocks 402, 404, 406, 408, 410, 412, 414, 416, 418, 420, and/or 422. It should be understood that the flow diagram 400 shows functionality and operation of one possible implementation of present embodiments. In this regard, each block of each flow diagram may represent a module, a segment, or a portion of program code, which includes one or more instructions executable by a processor for implementing specific logical functions or steps in the method. The program code may be stored on any type of computer readable medium (e.g., computer readable storage medium or non-transitory media), for example, such as a storage device including a disk or hard drive. In addition, each block may represent circuitry and/or an association of logic gates (which may be implemented by a Field Programmable Gate Array (FPGA)) that are wired to perform the specific logical functions in the process. Alternative implementations are included within the scope of the example embodiments of the present application in which functions may be executed out of order from that shown or discussed, including substantially concurrent or in reverse order, depending on the functionality involved, as would be understood by those reasonably skilled in the art.

Processing for method 400 may begin at decision block 402 where it is determined whether the Input signal is high. The Input signal may correspond to a signal on the input signal line 102 as illustrated by one or more of FIGS. 1-3.

As used throughout the specification, the terms "high" and "low" may refer to voltage levels on a signal line, and/or logic values in digital circuitry. As an example, a high voltage level, or "high" may be represented by a voltage level of five volts, while a low voltage level, or "low", may be represented by a voltage level of one or zero volts. Other voltage levels are possible as well and depend on the circuitry. Further, one skilled in the art would understand that the specific use of high and low voltages throughout the specification is not intended to be limiting. Depending on the circuitry, low voltages can be used where high voltages are described in the specification, and high voltages can be used where low voltages are described in the specification.

At block 402, if the Input signal is not high, then the method continues at decision block 402 where another determination is made of whether the Input signal is high. Flow continues in this manner until the Input signal is determined to be high, whereupon flow proceeds to block 404.

Next, at block 404, a Module Output signal (e.g., module output signal line 304) is set high, an overcurrent timer is set and subsequently started and an overvoltage timer is set and subsequently started. The overvoltage timer and the overcurrent timer are each set for values that are commensurate with the operating voltage of the system. The timer values may represent maximum allowable periods for a transistor to operate in an overload condition. Thus, depending on the voltage of the system, these maximum allowable periods may differ. For example, an overvoltage timer may be set for 100 microseconds when the system voltage is 12 volts, whereas the overvoltage time may be set for 50 microseconds when the system voltage is 24 volts. Other timer values and other system voltages are possible as well.

In order to for a module that implements method 400 (e.g., OPM 302) to determine the system voltage (so that the module can set appropriate overvoltage and overcurrent timers), the module may be provided with a system voltage signal line that carries a signal indicative of the system voltage. For example, this system voltage signal line may be an output of a voltage comparator (not shown). The system voltage signal may be high when the voltage comparator detects a system voltage of above 18 volts (thus indicating a 24 volt system), whereas the system voltage signal my be low when the voltage comparator detects a system voltage of below 18 volts (thus indicating a 12 volt system). These values are examples and those skilled in the art will recognize that other system voltage values are possible as well. Additionally, other methods are possible for determining the operating voltage of a system.

Next, at block 406, the method includes waiting for the expiration of the overvoltage timer (e.g., waiting for 100 microseconds). Upon expiration of the overvoltage timer, the method continues at decision block 408 where it is determined whether an overvoltage condition exists at the transistor. Different electrical circuits may have different standards as to what constitutes an overvoltage condition. For some circuits, it may be known that during normal operation the voltage on the output signal line 104 would never exceed 6 volts in a 12 volt system. Thus, in those circuits, any voltage on the output signal line 104 that exceeds 6 volts represents an overvoltage condition (e.g., a battery short). In other circuits, it may be known that during normal operation the voltage on the output signal line 104 would never exceed 12 volts in a 24 volt system. Thus, in those circuits, any voltage on the output signal line 104 that exceeds 12 volts represents an overvoltage condition (e.g., a battery short). Other methods for determining overvoltage conditions exist as well.

In order for a module that implements method 400 (e.g., OPM 302) to determine whether a voltage level on the output signal line 104 represents an overvoltage condition, the module may be provided with an overvoltage signal line that carries a signal indicative of an overvoltage condition. For example, an overvoltage signal line may be an output of a voltage comparator (not shown) designed to provide a high input with the voltage on the output signal line 104 does not represent an overvoltage condition, and designed to provide a low input when the voltage on the output signal line 104 represents an overvoltage condition. Other methods of providing an indication of whether a voltage on an output signal line represents an overvoltage condition are possible as well.

If at decision block 408 it is determined that an overvoltage condition exists, then flow continues at block 410 where the transistor is disabled temporarily. Disabling a transistor may include providing a low voltage to a base terminal of the transistor (e.g., via module output signal line 304), or taking some other action to remove a conduction channel within the transistor. Providing a low voltage to a base terminal of a transistor or otherwise removing a conduction channel within the transistor may halt the flow of current, thus allowing the transistor to dissipate heat and cool off. The transistor may be disabled for a preconfigured amount of time (e.g., 100 milliseconds). After expiration of the preconfigured amount of time, the flow continues again at decision block 402.

If at decision block 408 it is determined that an overvoltage condition does not exist, the flow continues at block 412 where the method includes waiting for the expiration of an overcurrent timer. Typically, the overcurrent timer is longer than the overvoltage timer, and thus, it is shown in method 400 as expiring after the overvoltage timer. However in some embodiments of the method, the overcurrent timer may be shorter that the overvoltage timer. Thus, in those embodiments, block 412 and other corresponding blocks (e.g., blocks 414, 416) may take place before blocks 406, 408, and 410.

Upon expiration of the overcurrent timer, flow proceeds to decision block 414 where it is determined whether an overcurrent condition exists at the transistor. Different circuits may have different standards as to what constitutes an overcurrent condition. For some circuits, an overcurrent condition may be represented by a threshold level current flowing after expiration of the overcurrent timer. It may be assumed, for example, that if a threshold level current is flowing after expiration of the overcurrent timer, the threshold level of current was flowing for the entire overcurrent timer period. Thus, the overcurrent timer value can be selected such that the power dissipated by the transistor resulting from a conduction of a threshold level current flowing during the time period of the overcurrent timer will not damage the transistor. An example threshold level current is 2 amps and an example overcurrent timer value is 2 milliseconds, though other threshold level current values and other overcurrent timer values are possible as well.

In order for a module implementing method 400 (e.g., OPM 302) to determine whether an overcurrent condition exists, the module may be provided with an overcurrent signal line that provides an indication of whether an overcurrent condition exists at a transistor. For example, an overcurrent signal line may be an output of a current comparator (not shown) operable to provide a high input when the current through the transistor does not exceed the threshold current level, and operable to provide a low input when the current through the transistor exceeds the threshold current level. Other methods of providing an indication of whether an overcurrent condition exists at a transistor are possible as well.

If at decision block 414 it is determined that an overcurrent condition exists, then flow continues at block 416 where the transistor is disabled temporarily. The transistor may be disabled so as to allow cooling in the same manner as in block 410, described above. The transistor may be disabled for the same time period as in block 410 or a different time period. The time period may be commensurate with the threshold level of current. Thus, for higher threshold levels of current, the time that the transistor is disabled may be longer. After expiration of the time period, the flow continues again at decision block 402.

If at decision block 414 it is determined that there is not an overcurrent condition, the flow continues at block 418 where the method waits for the Input signal (e.g., input signal line 104) to go low. When the Input signal goes low, the Module Output signal (e.g., module output signal line 304) is accordingly set low. Flow then proceeds to decision block 420 where, at a time when the Module Output signal transitions from high to low, it is determined whether there is an overvoltage condition. An overvoltage at the timer when the Module Output signal transitions from high to low suggests that during the time the Output signal was high, the voltage at the collector terminal of the transistor (i.e., the voltage on the output signal line 104) was not pulled low. Therefore, if it is determined that there is an overvoltage condition at block 420, flow proceeds to block 422 where the transistor is disabled temporarily. The transistor may be disabled so as to allow cooling in the same manner as in blocks 410 and 416, described above. The transistor may be disabled for the same time period as in blocks 410 and/or 416 or a different period.

In order for a module implementing method 400 (e.g., OPM 302) to determine whether an overvoltage condition exists at a time when the Module Output signal transitions from high to low, the module may be provided with a falling edge overvoltage signal line that carries a signal indicative of an overvoltage condition. For example, a falling edge overvoltage signal line may be an output of a voltage comparator (not shown) operable to provide a high input when the voltage at the collector terminal of the transistor does not exceed the threshold voltage level, and operable to provide a low input when voltage at the collector terminal of the transistor exceeds the threshold voltage level. The falling edge overvoltage signal line may be the same signal line as another overvoltage signal line described above. Other methods of providing an indication of whether an overvoltage condition exists at a time when the Module Output signal transitions from high to low are possible as well.

Following block 422, or following a determination that no overvoltage condition exists at block 420, flow proceeds back to block 402.

Figure 5:
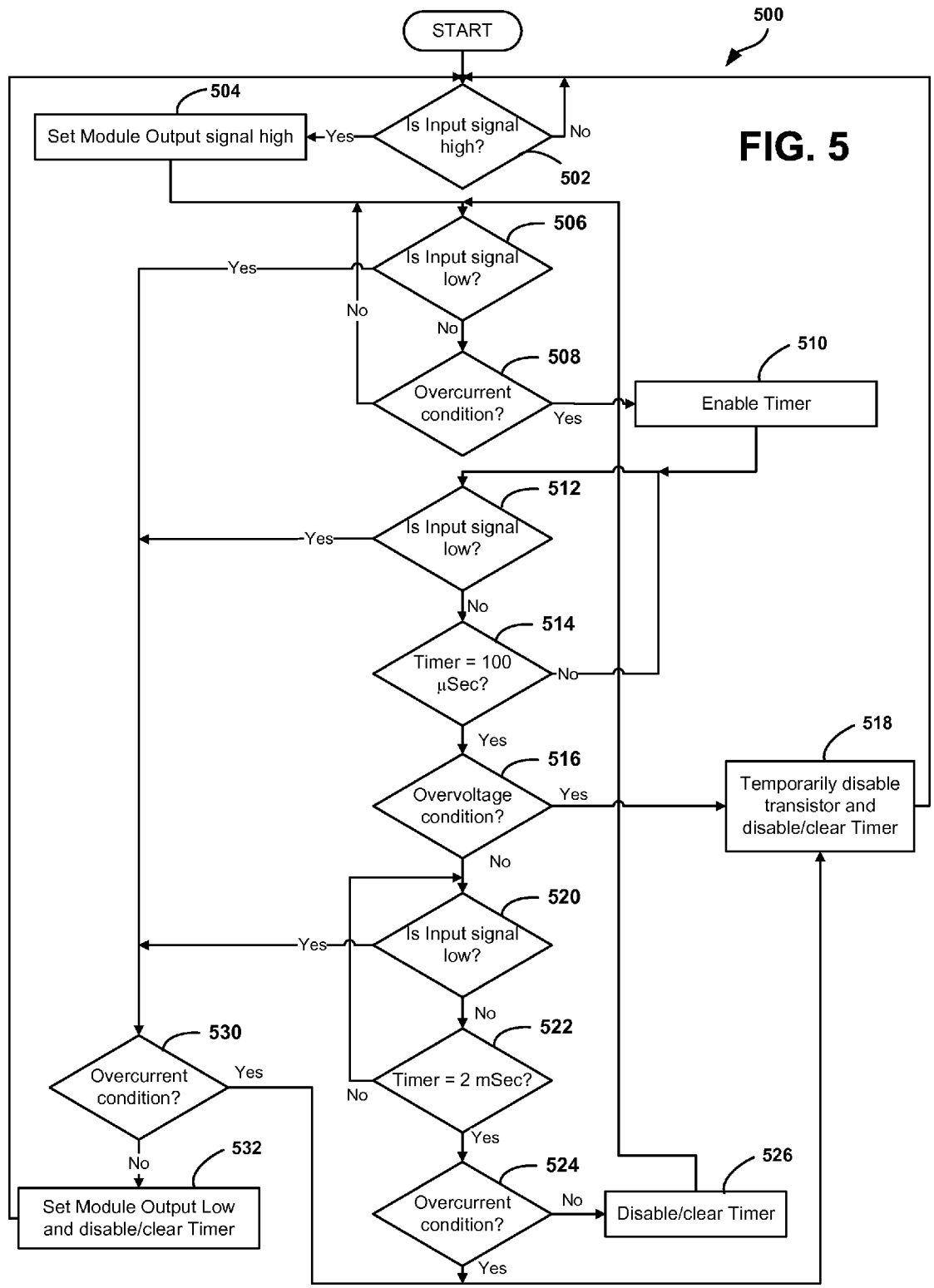
FIG. 5 is another flow diagram illustrating example steps of another overload protection method that are adapted in accordance with at least some embodiments described herein.

FIG. 5 is a flow diagram illustrating another example Overload Protection method 500. Example method 500 may include one or more operations, functions, or actions as illustrated by one or more of blocks 502, 504, 506, 508, 510, 512, 514, 516, 518, 520, 522, 524, 526, 530 and/or 532. It should be understood that, like flow diagram 400, flow diagram 500 shows functionality and operation of one possible implementation of present embodiments. In this regard, each block of each flow diagram may represent a module, a segment, or a portion of program code, which includes one or more instructions executable by a processor for implementing specific logical functions or steps in the method. The program code may be stored on any type of computer readable medium (e.g., computer readable storage medium or non-transitory media), for example, such as a storage device including a disk or hard drive. In addition, each block may represent circuitry and/or an association of logic gates (which may be implemented by a Field Programmable Gate Array (FPGA)) that are wired to perform the specific logical functions in the process. Alternative implementations are included within the scope of the example embodiments of the present application in which functions may be executed out of order from that shown or discussed, including substantially concurrent or in reverse order, depending on the functionality involved, as would be understood by those reasonably skilled in the art.

Processing for method 500 may begin at decision block 502 where it is determined whether the Input signal is high. The Input signal may correspond to a signal on the input signal line 102 as illustrated by one or more of FIGS. 1-3.

At block 502, if the Input signal is not high, then the method continues at decision block 502 where another determination is made of whether the Input signal is high. Flow continues in this manner until the Input signal is determined to be high, whereupon flow proceeds to block 504.

At block 504, a Module Output signal (e.g., module output signal line 304) is set high and flow proceeds to decision block 506.

At decision block 506, it is determined whether the Input signal has gone low. If the Input signal has gone low, flow proceeds to decision block 530, whereupon it is determined whether there is an overcurrent condition at the transistor. If at decision block 530 it is determined that there is no overcurrent condition, flow proceeds to block 532 where the Module Output is set low and the timer (e.g., from block 510) is cleared/disabled. If at decision block 530 it is determined that there is an overcurrent condition, flow proceeds to block 518 where the transistor is temporarily disabled and the timer (e.g., from block 510) is cleared/disabled.

As described above with respect to flow diagram 400, disabling a transistor may include providing a low voltage to a base terminal of the transistor (e.g., via module output signal line 304), or taking some other action to remove a conduction channel within the transistor. Providing a low voltage to a base terminal of a transistor or otherwise removing a conduction channel within the transistor may halt the flow of current, thus allowing the transistor to dissipate heat and cool off. The transistor may be disabled for a preconfigured amount of time (e.g., 100 milliseconds). After expiration of the preconfigured amount of time, the flow continues again at decision block 502.

If at decision block 506 it is determined that the input signal has not gone low, flow proceeds to decision block 508 where it is determined if there is an overcurrent condition. If there is no overcurrent condition determined at decision block 508, flow proceeds back to decision block 506. If there is an overcurrent condition determined at decision block 508, then flow proceeds to block 510 where a timer is enabled.

Following block 510, flow proceeds to decision block 512 where it is again determined if the input signal has gone low. If the input signal has gone low, as determined by decision block 512, then flow proceeds to decision block 530. If the input signal has not gone low, as determined by decision block 512, then flow proceeds to decision block 514.

At decision block 514 it is determined whether a first amount of time has expired from when the timer was enabled at block 510. This first amount of time may be based on a determined system voltage. For example, if it is determined that the system voltage is 12 volts, then the first amount of time may be on the order of 100 microseconds, but if it is determined that the system voltage is 24 volts, the first amount of time may be on the order of 50 microseconds. Other system voltages and other timer values are possible as well.

At block 514, if it is determined that a first amount of time (e.g., 100 microseconds) has not expired, flow proceeds back to decision block 512. If, however, at block 514, it is determined that the first amount of time has expired, flow proceeds to decision block 516 where it is determined whether there is an overvoltage condition.

At block 516, if it is determined that there is an overvoltage condition, then flow proceeds to block 518 where the transistor is temporarily disabled for a preconfigured amount of time and the timer is disabled/cleared. After expiration of the preconfigured amount of time, flow proceeds back to decision block 502.

At block 516, if it is determined that there is no overvoltage condition, flow proceeds to decision block 520 where it is determined whether the input signal has gone low.

At block 520, if it is determined that the input signal has gone low, flow proceeds to decision block 530. But if at block 516 it is determined that the input signal has not gone low, flow proceeds to decision block 522 where it is determined whether a second amount of time (e.g., 2 milliseconds) has expired from when the timer was enabled at block 510. If this second amount of time has not expired, flow proceeds back to decision block 520

At block 522, if it is determined that the second amount of time (e.g., 2 milliseconds) has expired from when the timer was enabled at block 510, flow proceeds to decision block 524 where it is determined whether there is an overcurrent condition. If there is no overcurrent condition determined by block 524, then flow proceeds to block 526 where the timer (e.g., from block 510) is disabled and cleared. Flow then proceeds back to decision block 506. If, however, at block 524, it is determined that there is an overcurrent condition, flow proceeds to block 518 where the transistor is temporarily disabled for a preconfigured amount of time and the timer is disabled/cleared. After expiration of the preconfigured amount of time, flow proceeds back to decision block 502.

Figure 6:
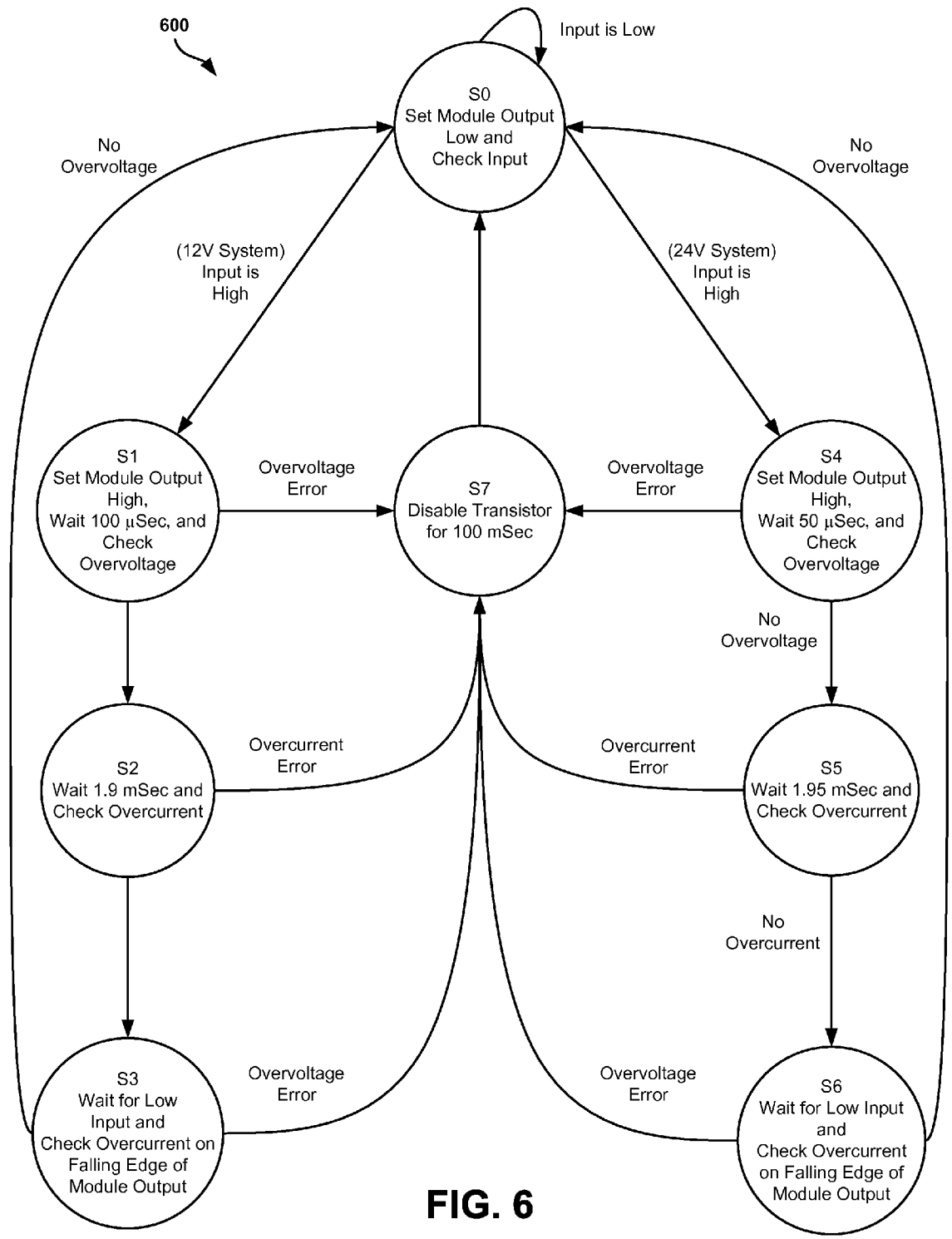
FIG. 6 is an example state transition diagram illustrating example modes of operation that are adapted in accordance with at least some embodiments described herein.

FIG. 6 illustrates an example state transition diagram 600 corresponding to the example method 400. State transition diagram 600 includes eight states, S0, S1, S2, S3, S4, S5, S6, and S7 in which a module (e.g., OPM 302) may operate. It should be understood that state transition diagram 600 illustrates example states, or modes, of operation for preventing and/or eliminating transistor overload according to one possible implementation of present embodiments. In this regard, the functions, processes, or actions, that characterize each state may be executed by one or more modules, segments, or portions of program code, which may include one or more instructions executable by a processor for implementing specific logical functions or steps. The program code may be stored on any type of computer readable medium (e.g., computer readable storage medium or non-transitory media), for example, such as a storage device including a disk or hard drive. In addition, the states may represent circuitry and/or an association of logic gates (which may be implemented by a Field Programmable Gate Array (FPGA)) that are wired to perform the specific logical functions that characterize each state. Alternative implementations are included within the scope of the example embodiments of the present application in which state transitions may be different from that shown or discussed, depending on the functionality involved, as would be understood by those reasonably skilled in the art.

A state diagram flow begins at state S0 where a module output signal (e.g., module output signal line 304) is set low and an input signal (e.g., input signal line 102) is checked. Flow remains at state S0 while the input signal is low. When the input signal (e.g., input signal line 102) goes high, flow will proceed to state S1 or state S4 depending on whether the system is a 12 volt system or a 24 volt system. These system voltage values are example system voltage values, and one skilled in the art should understand that other system voltage values are possible as well.

At state S1 or S4, the module output signal (e.g., module output signal line 304) is set high and an overvoltage timer is started (e.g., 100 microseconds or 50 microseconds depending on the system voltage). Upon expiration of the overvoltage timer, an overvoltage condition is checked. If there is an overvoltage condition, flow proceeds to state S7 where the transistor is disabled for a period of time (e.g., 100 milliseconds). If no overvoltage condition exists, then flow proceeds to state S2 or S5.

At state S2 or S5, flow waits for a remaining amount of time to expire before checking an overcurrent condition. For example, at state S2, flow waits an additional 1.9 milliseconds for a total elapsed time of 2 milliseconds, and at state S5, flow waits an additional 1.95 milliseconds for a total elapsed time of 2 milliseconds. If there is an overcurrent condition, flow proceeds to state S7 where the transistor is disabled for a period of time (e.g., 100 milliseconds). If there is no overcurrent condition, flow proceeds to state S3 or S6.

At state S3 or S6, flow waits for the input signal to go low and accordingly sets the module output signal low. At the time when the module output signal transitions from high to low, a determination is made of whether an overcurrent condition exists. If an overcurrent condition exists, flow proceeds to state S7 where the transistor is disabled for a period of time (e.g., 100 milliseconds). If no overcurrent condition exists, then flow returns to state S0.

Following any disabling of the transistor at state S7, flow proceeds back to state S0.

Figure 7:
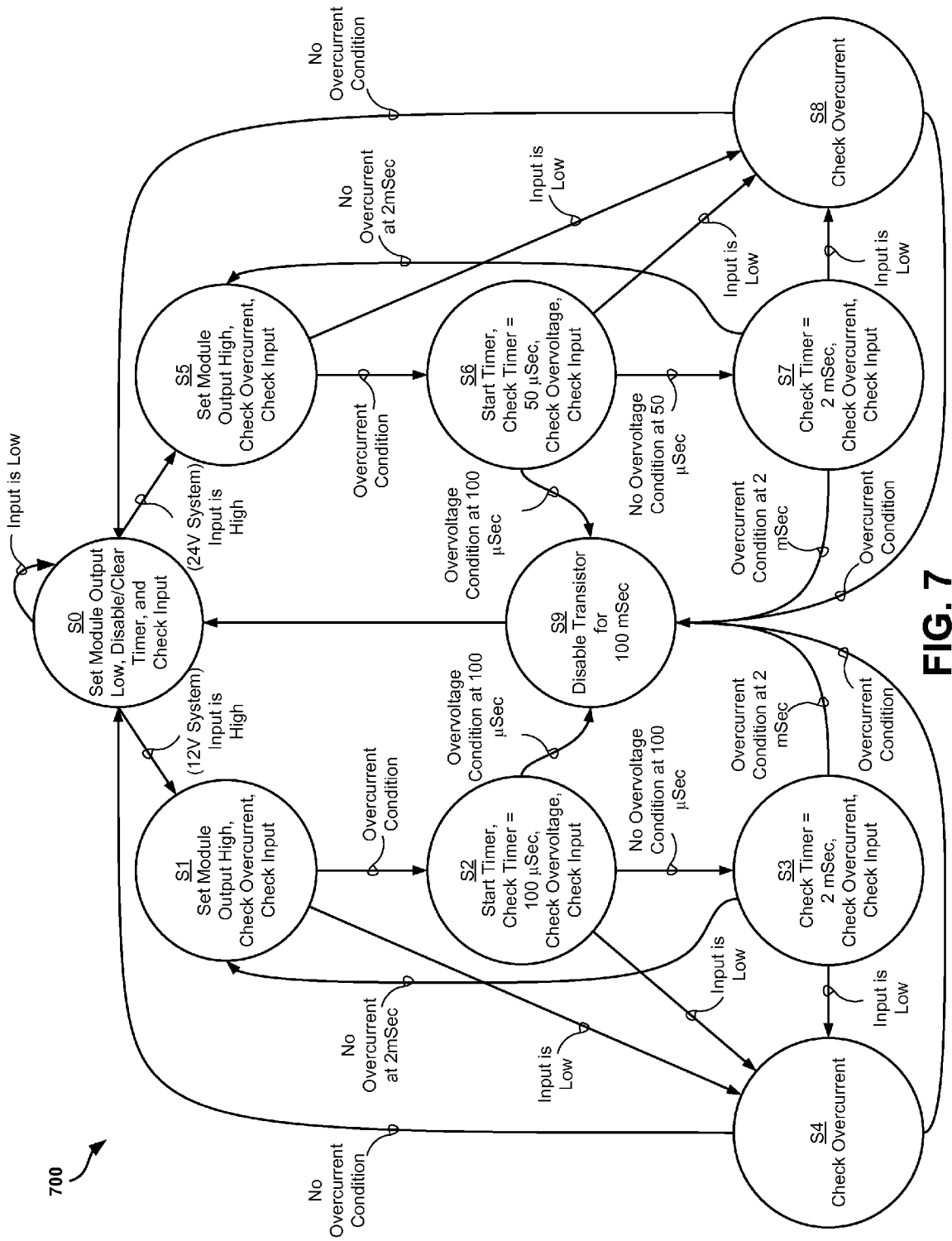
FIG. 7 is another example state transition diagram illustrating example modes of operation that are adapted in accordance with at least some embodiments described herein.

FIG. 7 illustrates another example state transition diagram 700 corresponding to the example method 500. State transition diagram 700 includes ten states, S0, S1, S2, S3, S4, S5, S6, S7, S8, and S9 in which a module (e.g., OPM 302) may operate. As described above with respect to state transition diagram 600, it should be understood that state transition diagram 700 illustrates example states, or modes, of operation for preventing and/or eliminating transistor overload according to one possible implementation of present embodiments. In this regard, the functions, processes, or actions, that characterize each state may be executed by one or more modules, segments, or portions of program code, which may include one or more instructions executable by a processor for implementing specific logical functions or steps. The program code may be stored on any type of computer readable medium (e.g., computer readable storage medium or non-transitory media), for example, such as a storage device including a disk or hard drive. In addition, the states may represent circuitry and/or an association of logic gates (which may be implemented by a Field Programmable Gate Array (FPGA)) that are wired to perform the specific logical functions that characterize each state. Alternative implementations are included within the scope of the example embodiments of the present application in which state transitions may be different from that shown or discussed, depending on the functionality involved, as would be understood by those reasonably skilled in the art.

A state diagram flow begins at state S0 where a module output signal (e.g., module output signal line 304) is set low, a timer is disabled/cleared, and an input signal (e.g., input signal line 102) is checked. Flow remains at state S0 while the input signal is low. When the input signal (e.g., input signal line 102) goes high, flow will proceed to state S1 or state S5 depending on whether the system is a 12 volt system or a 24 volt system. These system voltage values are example system voltage values, and one skilled in the art should understand that other system voltage values are possible as well.

At state S1 or S5, the module output signal (e.g., module output signal line 304) is set high, an overcurrent condition is checked, and the input is checked. If the input goes low, flow proceeds to state S4 or S8, and if there is an overcurrent condition, flow proceeds to state S2 or S6.

At state S4 or S8, it is determined whether there is an overcurrent condition. When it is determined that there is an overcurrent condition, flow proceeds to state S9 where the transistor is disabled for a period of time (e.g., 100 milliseconds). If at state S4 or S8, it is determined that there is no overcurrent condition, flow returns back to state S0.

At state S2 or S6, the input is checked, a timer is started (if not already started), the timer value is checked to determine whether a first amount of time has expired from when the timer was started, and an overvoltage condition is checked. If at state S2 or S6 the input is determined to have gone low, flow proceeds to state S4 or S8.

Depending on the system voltage, the first amount of time can take on different values. For example, when the system voltage is 12 volts (e.g., at state S2), the first amount of time may be 100 microseconds, whereas when the system voltage is 24 volts (e.g., at state S6), the first amount of time may be 50 microseconds.

Upon expiration of the first amount of time at state S2 or S6, an overvoltage condition is checked. If it is determined that there is an overvoltage condition after expiration of the first amount of time, then flow proceeds to state S9 where the transistor is disabled for a period of time (e.g., 100 milliseconds). After disabling of the transistor, flow proceeds back to state S0.

If at state S2 or S6 it is determined that there is no overvoltage condition upon expiration of the first amount of time, then flow proceeds to state S3 or S7.

At state S3 or S7, the timer is checked to determine whether a second amount of time (e.g., 2 milliseconds) has expired from when the timer was started, an overcurrent condition is checked, and the input is checked. If at state S3 or S7 the input has gone low, flow proceeds to state S4. If at state S3 or S7, it is determined that there is an overcurrent condition but the second amount of time has not expired, flow returns to state S1 or S5. And if at state S3 or S7, it is determined that there is an overcurrent condition after expiration of the second amount of time, flow proceeds to state S9 where the transistor is disabled for a period of time (e.g., 100 milliseconds).

Following any disabling of the transistor at state S9, flow proceeds back to state S0.

Figure 8:
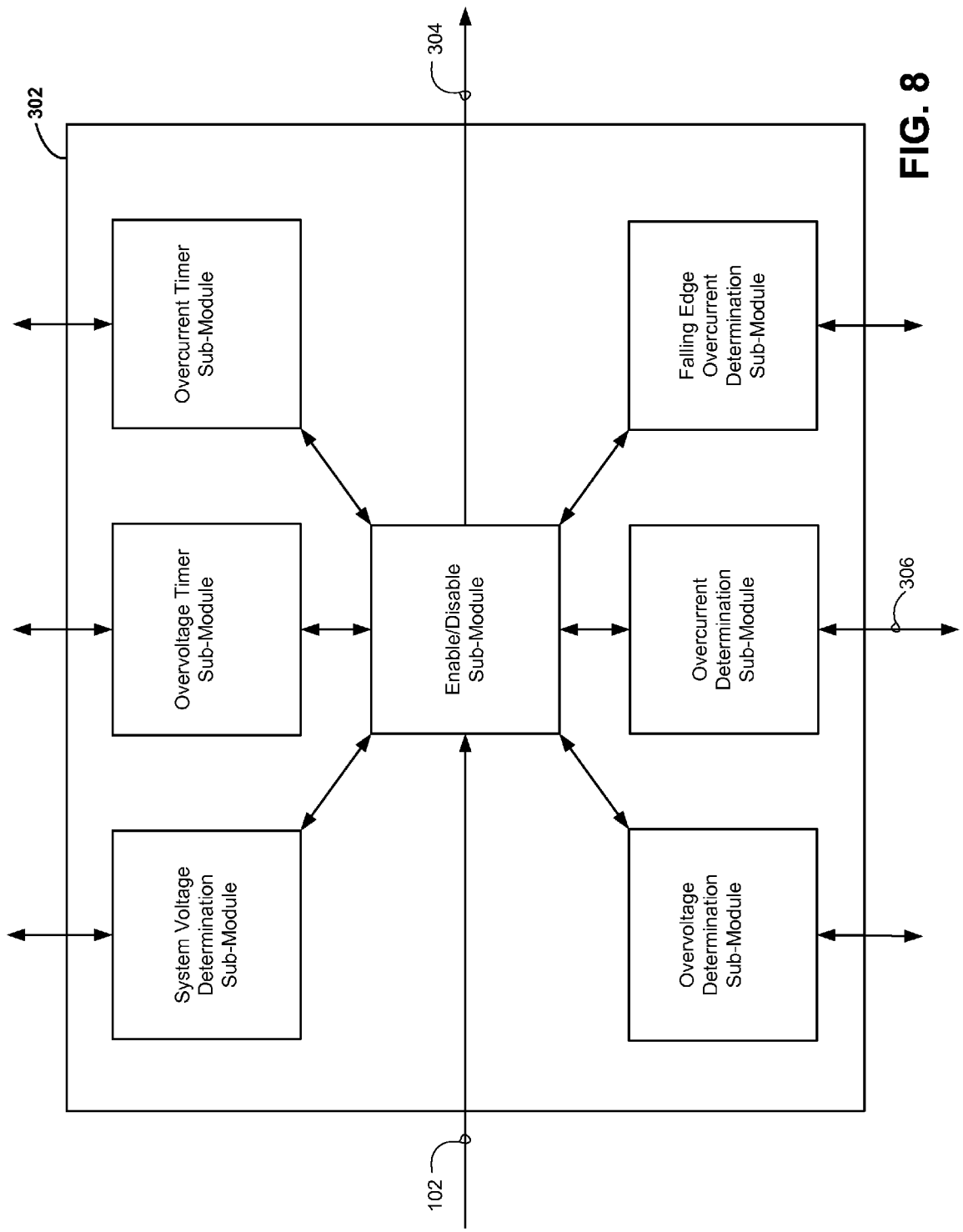
FIG. 8 is an illustration of an example Overload Protection Module adapted in accordance with at least some embodiments presented herein.

FIG. 8 illustrates several example sub-modules that may collectively form an example Overload Protection Module 302 that may be designed to implement one or more of functions or processes described with reference to FIGS. 4-7. The sub-modules may be implemented via appropriate digital logic circuitry (e.g., an FPGA), appropriate analog circuitry, which may interface with other parts of an electrical circuit in order to provide information to the OPM 302, a digital computing device, and/or computer readable media containing instructions stored thereon, which when executed by a computing device, causes the computing device to carry out one or more functions described with reference to FIGS. 4-7.

For example, module 302 is shown as including an enable/disable sub-module that receives a signal from an input signal line 102 and provides a signal to an output signal line 304. The output signal line 304, may, for example, couple to a base terminal of a transistor. The enable/disable sub-module is also shown coupled to the other sub-modules within module 302. These include an overvoltage determination sub-module, a falling edge overcurrent determination sub-module, an overcurrent determination sub-module, a system voltage determination sub-module, an overvoltage timer sub-module, and an overcurrent timer sub-module. In some embodiments, the overvoltage timer sub-module and the overcurrent timer sub-module may comprise a single timer sub-module.

The overvoltage determination sub-module may comprise circuitry (e.g., a voltage comparator with a variable threshold) for determining whether an overvoltage condition exists at a collector terminal of a transistor. The overvoltage determination sub-module may provide an indication to the enable/disable sub-module of whether an overvoltage condition exists.

Likewise, overcurrent determination sub-module may comprise circuitry (e.g., a current comparator) for determining whether an overcurrent condition exists at a transistor. Overcurrent determination sub-module may receive an input (e.g., feedback line 306) that provides an indication of the current flowing through the transistor Q1. The overcurrent determination sub-module may provide an indication to the enable/disable sub-module of whether an overcurrent condition exists.

Falling edge overcurrent determination sub-module may comprise circuitry (e.g., a comparator) for determining, at a time immediately before the output signal 304 transitions from high to low, whether an overcurrent condition exists at a collector terminal of a transistor. The enable/disable sub-module may provide an indication to the falling edge overvoltage determination sub-module that a signal on the output signal line 304 is about to transition from high to low (i.e., pre-falling edge). And accordingly, the falling edge overcurrent determination sub-module may provide to the enable/disable sub-module an indication of whether there is an overcurrent condition.

Overvoltage timer sub-module and overcurrent timer sub-module may comprise a timing mechanism able to provide an indication of when a set time expires. This indication may be provided to the enable/disable sub-module and used to determine whether to check whether various error conditions exist.

System voltage determination module may comprise circuitry (e.g., a voltage comparator) that interfaces with an electrical circuit coupled to OPM 302 (e.g., electrical circuit 300) to determine the system voltage of the electrical circuit. For example, the system voltage determination sub-module may determine that an input to the system voltage determination sub-module of 18 volts (or less) indicates as 12 volt system, whereas an input of greater than 18 volts indicates connection to a 24 volt system. Other thresholds and system voltages are possible as well.

The system voltage determination sub-module may provide an indication of the system voltage to one or more other sub-modules. For example, the system voltage determination sub-module may provide an indication of the system voltage to the overvoltage timer sub-module. And based on the indication of the system voltage, the overvoltage timer sub-module may set an appropriate overvoltage timer. For instance, if the system voltage is determined to be 12 volts, the overvoltage timer may be set at 100 microseconds, whereas if the system voltage is determined to be 24 volts, the overvoltage timer may be set at 50 microseconds. Other system voltage values and overvoltage timer values are possible as well.

The Enable/Disable sub-module may comprise appropriate circuitry for receiving inputs from each of the other sub-modules, and for determining, based on those inputs, whether to set the module output signal line 304 high or low. Such determinations may be made according to the blocks of flow diagrams 400 and 500 and the states of state transition diagrams 600 and 700.

Figure 9:
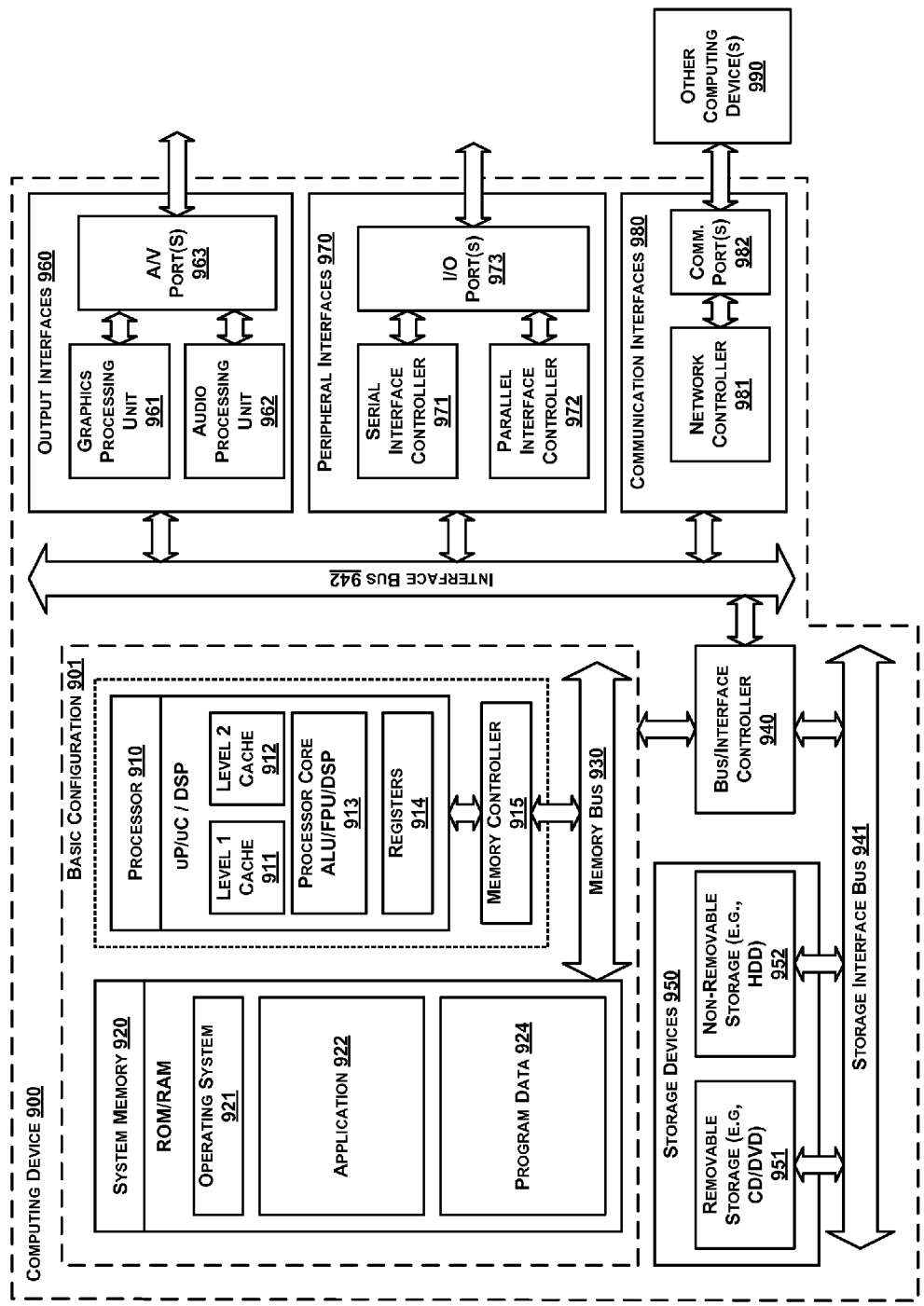
FIG. 9 is a block diagram illustrating an example computing device arranged for executing software instructions to carry out at least some embodiments presented herein.

FIG. 9 is a block diagram illustrating an example computing device 900 that may comprise, or otherwise be integrated with, one or more sub-modules that collectively form the Overload Protection Module 302. All or part of computing device 900 may be embedded within module 302.

In a very basic configuration 901, computing device 900 typically includes one or more processors 910 and system memory 920. A memory bus 930 can be used for communicating between the processor 910 and the system memory 920.

Depending on the desired configuration, processor 910 can be any type including but not limited to a microprocessor (μP), a microcontroller (μC), a digital signal processor (DSP), or any combination thereof Processor 910 can include one more levels of caching, such as a level one cache 911 and a level two cache 912, a processor core 913, and registers 914. The processor core 913 can include an arithmetic logic unit (ALU), a floating point unit (FPU), a digital signal processing core (DSP Core), or any combination thereof A memory controller 915 can also be used with the processor 910, or in some implementations the memory controller 915 can be an internal part of the processor 910.

Depending on the desired configuration, the system memory 920 can be any type including but not limited to volatile memory (such as RAM), non-volatile memory (such as ROM, flash memory, etc.) or any combination thereof. System memory 920 typically includes an operating system 921, one or more applications 922, and program data 924.

Computing device 900 can have additional features or functionality, and additional interfaces to facilitate communications between the basic configuration 901 and other portions of a circuit. For example, a bus/interface controller 940 can be used to facilitate communications between the basic configuration 901 and one or more data storage devices 950 via a storage interface bus 941. The data storage devices 950 can be removable storage devices 951, non-removable storage devices 952, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 900. Any such computer storage media can be part of device 900.

Computing device 900 can also include an interface bus 942 for facilitating communication from various interface devices (e.g., output interfaces, peripheral interfaces, communication interfaces, etc.) to the basic configuration 901 via the bus/interface controller 940. Example output interfaces 960 include a graphics processing unit 961 and an audio processing unit 962, which can be configured to communicate to various external devices such as a display or speakers via one or more A/V ports 963. Example peripheral interfaces 960 include a serial interface controller 971 or a parallel interface controller 972, which can be configured to communicate with external devices such as input devices (e.g., keyboard, mouse, pen, voice input device, touch input device, etc.) or other peripheral devices (e.g., printer, scanner, etc.) via one or more I/O ports 973. An example communication interface 980 includes a network controller 981, which can be arranged to facilitate communications with one or more other computing devices 990 over a network communication via one or more communication ports 982. The Communication connection (between communication port(s) 982 and other computing device(s) 990) is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media (or medium) as used herein can include both storage media and communication media.

Computing device 900 can be implemented in a vehicle diagnostic scanner module, such as that described in U.S. Provisional Patent Application No. 61/374,723, which is hereby incorporated by reference in its entirety, is filed on an even date herewith, and is titled Method and apparatus to use remote and local control modes to acquire and visually present data. Computing device 900 can also be implemented as a portion of a small-form factor portable (or mobile) electronic device such as a cell phone, a personal data assistant (PDA), a personal media player device, a wireless web-watch device, a personal headset device, an application specific device, or a hybrid device that includes any of the above functions. Computing device 900 can also be implemented as a personal computer including both laptop computer and non-laptop computer configurations.

Figure 10:
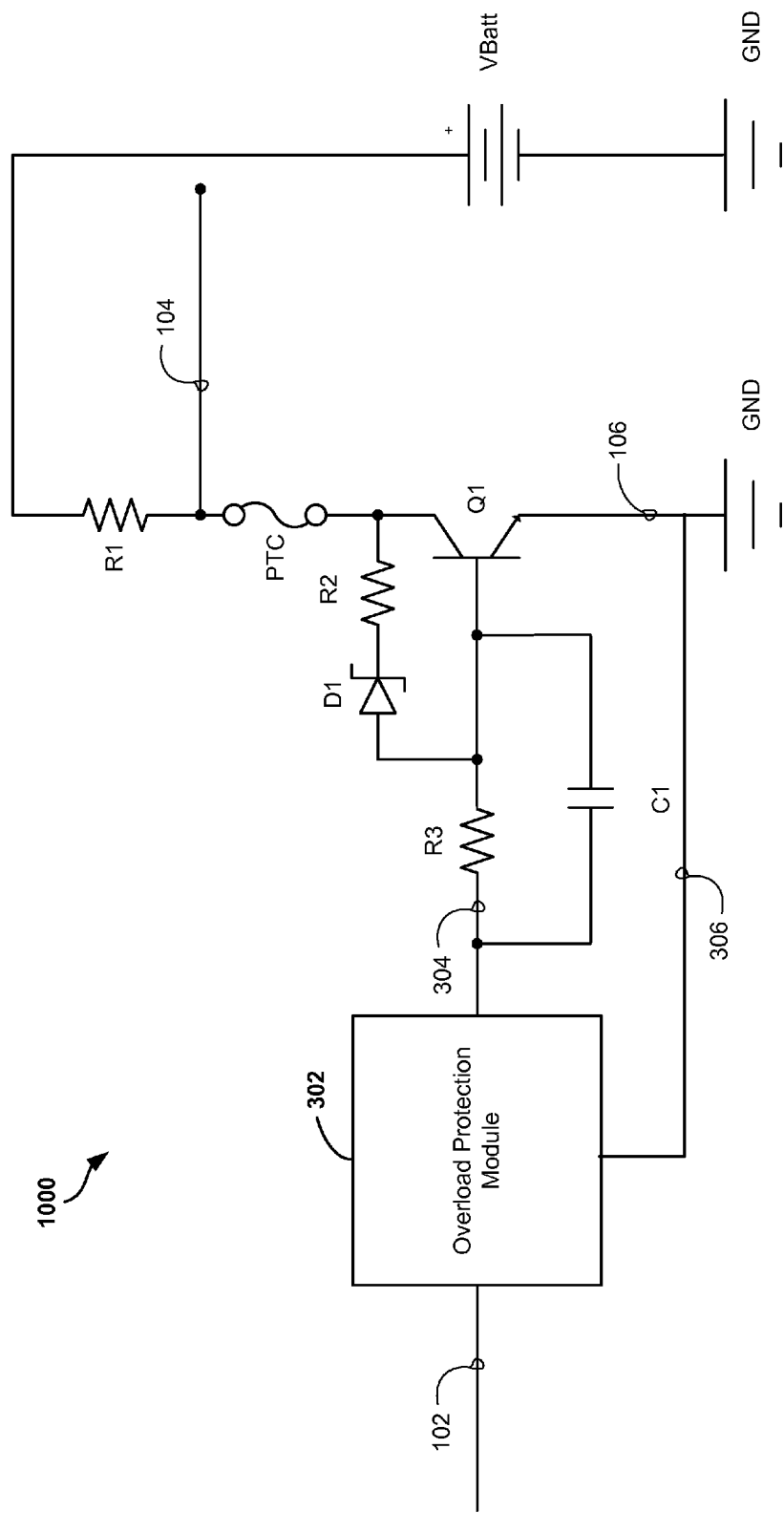
FIG. 10 is an illustration of an example circuit that includes components for preventing and/or eliminating an overload condition and allowing for fast signal switching in accordance with at least some embodiments described herein.

FIG. 10 illustrates an example communication circuit 1000 that includes Overload Protection Module 302, a PTC device, and additional components designed to facilitate fast switching. Signal lines that are coupled in some manner to transistor Q1 (e.g., output signal line 104) may be desired to be driven back and forth between high and low voltages at speeds as high as 115200 baud (or higher depending on the embodiment). Therefore, additional components may be included in the circuit to help the circuit obtain those switching speeds.

Circuit 1000 is shown as including a Schottky diode D1 coupled between the collector terminal and the base terminal of transistor Q1. This diode configuration, known as a Baker clamp, may help to prevent the transistor Q1 from operating in a saturated operation mode by inhibiting a large buildup of carriers in the base region of Q1. The more carriers there are in the base region of a transistor, the longer it takes to turn off the transistor. Therefore, reducing the number of carriers in the base may result in faster switching.

Circuit 1000 is also shown as including a resistor R2 coupled between the diode D1 and the collector terminal of transistor Q1. This resistor may help limit the amount of current that flows through the diode D1. Because of inductance, a signal on a signal line (e.g., output signal line 104) tends to drive the voltage at the collector to a lower level than the transistor pulled it. Without the resistor R2, almost all of the base drive current flows through the diode D1 resulting in transistor remaining in an off state. The resistor R2 may help to prevent this condition.

Circuit 1000 also includes a resistor R3 coupled between the Overload Protection Module 302 and the base terminal of transistor Q1, and a capacitor C1 coupled in parallel to resistor R3.

The capacitor C1 acts as a low impedance coupling during times when a signal on module output line 304 transitions from high to low (or vice versa), and thus helps to remove carriers during an off transition and helps to add carriers during an on transition. This action may lead to faster switching times as well.

III. Conclusion

Example embodiments have been described above. Those skilled in the art will understand that changes and modifications may be made to the described embodiments without departing from the true scope and spirit of the application, which is defined by the claims.

What is claimed:

1. A method for protecting a transistor against overload, the method comprising:

providing an input signal to a base terminal of a transistor for a first amount of time;

determining whether a system voltage of a system that includes the transistor is above a threshold operating voltage level, wherein when the system voltage is above the threshold operating voltage level, the first amount of time comprises a first predetermined amount of time, and wherein when the system voltage is below the threshold operating voltage level, the first amount of time comprises a second predetermined amount of time;

upon expiration of the first amount of time, making a determination of whether an overload condition exists at the transistor, wherein making a determination of whether an overload condition exists at the transistor comprises making a determination of whether a voltage level at a collector terminal of the transistor exceeds a threshold collector voltage level;

disabling the transistor for a second amount of time when the determination is that an overload condition exists at the transistor; and providing the input signal to the base terminal upon expiration of the second amount of time.

2. The method of claim 1, wherein making a determination of whether an overload condition exists at the transistor comprises making a determination of whether an amount of current flowing through the transistor exceeds a threshold current level.

3. The method of claim 1, wherein making a determination of whether an overload condition exists at the transistor comprises making a determination of whether an amount of current flowing through the transistor is greater than a threshold current level just prior to a falling edge of a signal provided to the base terminal of the transistor.

4. A method for protecting a transistor against overload, the method comprising:

providing an input signal to a base terminal of a transistor for a first amount of time;

upon expiration of the first amount of time, making a determination of whether an overload condition exists at the transistor;

disabling the transistor for a second amount of time when the determination is that an overload condition exists at the transistor;

providing the input signal to the base terminal upon expiration of the second amount of time;

upon expiration of a third amount of time, making a determination of whether an additional overload condition exists at the transistor;

disabling the transistor for a fourth amount of time when the determination is that an additional overload condition exists at the transistor; and providing the input signal to the base terminal upon expiration of the fourth amount of time.

5. The method of claim 4, wherein making a determination of whether an overload condition exists at the transistor comprises making a determination of whether a voltage level at a collector terminal of the transistor exceeds a threshold collector voltage level, and wherein making a determination of whether an additional overload condition exists at the transistor comprises making a determination of whether an amount of current flowing through the transistor exceeds a threshold current level.

6. The method of claim 4, wherein making a determination of whether an additional overload condition exists at the transistor comprises making a determination of whether a current flowing through the transistor is greater than a threshold level at a time just prior to when a signal provided to the base terminal of the transistor transitions from high to low.

7. A circuit comprising:

a first signal line coupled to a collector terminal of a transistor;

an overload protection module coupled between a second signal line and a base terminal of the transistor, the overload protection module including:

means for applying a signal to the base terminal of a transistor for a first amount of time, the signal representative of a signal on the second signal line;

means for making a determination of whether an overload condition exists at the transistor upon expiration of the first amount of time, wherein the means for making a determination of whether an overload condition exists at the transistor comprises means for making a determination of whether a voltage level at the collector terminal of the transistor exceeds a threshold collector voltage level;

means for disabling the transistor for a second amount of time when the determination is that an overload condition exists at the transistor; and means for applying the signal to the base terminal upon expiration of the second amount of time and means for determining a system voltage of the circuit is above a threshold operating voltage level, wherein when the system voltage is above a threshold operating voltage level, the first amount of time comprises a first predetermined amount of time, and wherein when the system voltage is below a threshold operating voltage level, the first amount of time comprises a second predetermined amount of time.

8. The circuit of claim 7, wherein the means for making a determination of whether an overload condition exists at the transistor comprises means for making a determination of whether an amount of current flowing through the transistor exceeds a threshold current level.

9. The circuit of claim 7, wherein the means for making a determination of whether an overload condition exists at the transistor comprises means for making a determination of whether an amount of current flowing through the transistor is greater than a threshold current level just prior to a time when a signal applied to the base terminal transitions from high to low.

10. A circuit comprising:
a first signal line coupled to a collector terminal of a transistor;
an overload protection module coupled between a second signal line and a base terminal of the transistor, the overload protection module including:
means for applying a signal to the base terminal of a transistor for a first amount of time, the signal representative of a signal on the second signal line;
means for making a determination of whether an overload condition exists at the transistor upon expiration of the first amount of time;
means for disabling the transistor for a second amount of time when the determination is that an overload condition exists at the transistor;
means for applying the signal to the base terminal upon expiration of the second amount of time; and
means for making a determination, upon expiration of a third amount of time, of whether an additional overload condition exists at the transistor;
means for disabling the transistor for a fourth amount of time when the additional overload condition exists at the transistor; and
means for applying the signal on the second signal line to the base terminal upon expiration of the fourth amount of time.

11. The circuit of claim 10, wherein the means for making a determination of whether an overload condition exists at the transistor comprises means for making a determination of whether a voltage level at the collector terminal of the transistor has exceeded a threshold collector voltage level, and wherein the means for making a determination of whether an additional overload condition exists at the transistor comprises means for making a determination of whether an amount of current flowing through the transistor exceeds a threshold current level.

12. The circuit of claim 10, wherein the means for making a determination of whether an additional overload condition exists at the transistor comprises means for making a determination of whether a current flowing through the transistor is greater than a threshold current level just prior to a time when a signal applied to the base terminal transitions from high to low.

13. A field programmable gate array (FPGA) having an association of logic gates, wherein the logic gates are wired to perform functions, the functions comprising:
providing an input signal to a base terminal of a transistor for a first amount of time;
upon expiration of the first amount of time, making a determination of whether an overload condition exists at the transistor;
disabling the transistor for a second amount of time when the determination is that an overload condition exists at the transistor;
providing the input signal to the base terminal upon expiration of the second amount of time; and
upon expiration of a third amount of time, making a determination of whether an additional overload condition exists at the transistor;
disabling the transistor for a fourth amount of time when the determination is that an additional overload condition exists at the transistor; and
providing the communication signal to the base terminal upon expiration of the fourth amount of time.

14. The FPGA of claim 13, wherein making a determination of whether an overload condition exists at the transistor comprises making a determination of whether a voltage level at a collector terminal of the transistor exceeds a threshold collector voltage level, and wherein making a determination of whether an additional overload condition exists at the transistor comprises making a determination of whether an amount of current flowing through the transistor exceeds a threshold current level.

* * * * *